(12) United States Patent
Hui et al.

(10) Patent No.: US 11,330,737 B2
(45) Date of Patent: May 10, 2022

(54) HEAT SINK AND COMMUNICATIONS PRODUCT

(71) Applicant: HUAWEI TECHNOLOGIES CO., LTD., Guangdong (CN)

(72) Inventors: Xiaowei Hui, Dongguan (CN); Yuping Hong, Dongguan (CN); Wei Chen, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/079,408

(22) Filed: Oct. 23, 2020

(65) Prior Publication Data

US 2021/0045263 A1    Feb. 11, 2021

Related U.S. Application Data

(63) Continuation of application No. 16/458,711, filed on Jul. 1, 2019, now Pat. No. 10,820,448, which is a continuation of application No. PCT/CN2017/118641, filed on Dec. 26, 2017.

(30) Foreign Application Priority Data

Dec. 30, 2016   (CN) .......................... 201611260377.6

(51) Int. Cl.
  *H05K 7/20*    (2006.01)
(52) U.S. Cl.
  CPC ..... *H05K 7/20281* (2013.01); *H05K 7/20263* (2013.01); *H05K 7/20272* (2013.01)

(58) Field of Classification Search
  None
  See application file for complete search history.

(56) References Cited

U.S. PATENT DOCUMENTS

| | | | | |
|---|---|---|---|---|
| 4,125,122 A | * | 11/1978 | Stachurski | .............. H01L 35/30 136/205 |
| 5,170,319 A | * | 12/1992 | Chao-Fan Chu | ... H01L 23/4338 165/170 |
| 6,496,375 B2 | | 12/2002 | Patel et al. | |
| 7,965,508 B2 | | 6/2011 | Yamamoto et al. | |
| 8,737,071 B2 | | 5/2014 | Hao et al. | |
| 8,919,426 B2 | | 12/2014 | Hardesty | |

(Continued)

FOREIGN PATENT DOCUMENTS

| CN | 101216209 A | 7/2008 |
|---|---|---|
| CN | 104661494 A | 5/2015 |

(Continued)

*Primary Examiner* — Courtney L Smith
(74) *Attorney, Agent, or Firm* — James Anderson Harrison

(57) ABSTRACT

A heat sink includes a base and a plurality of fins. A root of the fin is connected to the base. A heated area, a dropping pipe, and a spacing strip between the heated area and the dropping pipe are formed in the fin. A first passage and a second passage are formed between the heated area and the dropping pipe. A hydraulic diameter of a pipeline in the heated area is less than a critical dimension. A hydraulic diameter of a pipeline of the dropping pipe is greater than or equal to the critical dimension, and a pressure of liquid at an intersection of the second passage and the dropping pipe is greater than a pressure of liquid at an intersection of the second passage and the heated area.

20 Claims, 5 Drawing Sheets

(56) References Cited

U.S. PATENT DOCUMENTS

| | | | |
|---|---|---|---|
| 9,342,121 B2 | 5/2016 | Anderl et al. | |
| 9,497,888 B2 | 11/2016 | Arvelo et al. | |
| 10,279,653 B2 | 5/2019 | Takagi et al. | |
| 10,602,638 B2 | 3/2020 | North et al. | |
| 10,820,448 B2* | 10/2020 | Hui | H05K 7/20272 |
| 2009/0101308 A1 | 4/2009 | Hardesty | |
| 2009/0229794 A1* | 9/2009 | Schon | F24S 10/95 165/104.21 |
| 2013/0005372 A1* | 1/2013 | Strei | F28D 15/0275 455/500 |
| 2014/0110834 A1* | 4/2014 | Kusaka | H05K 7/20918 257/722 |
| 2015/0136358 A1 | 5/2015 | Gradinger et al. | |

FOREIGN PATENT DOCUMENTS

| | | |
|---|---|---|
| CN | 205104482 U | 3/2016 |
| CN | 106686947 A | 5/2017 |
| EP | 2677261 A1 | 12/2013 |
| EP | 2876400 A1 | 5/2015 |
| KR | 20130111035 A | 10/2013 |

* cited by examiner

HEAT SINK AND COMMUNICATIONS PRODUCT

CROSS-REFERENCE TO RELATED APPLICATIONS

This application is a continuation of U.S. patent application Ser. No. 16/458,711, filed on Jul. 1, 2019, which is a continuation of International Application No. PCT/CN2017/118641, filed on Dec. 26, 2017, The International Application claims priority to Chinese Patent Application No. 201611260377.6, filed on Dec. 30, 2016. All of the aforementioned patent applications are hereby incorporated by reference in their entireties.

TECHNICAL FIELD

The present disclosure relates to the field of communications technologies, and in particular, to a heat sink and a communications product to which the heat sink is applied.

BACKGROUND

A wireless module is widely applied in the field of communications technologies. The wireless module is disposed in a communications product to implement signal transmitting and receiving. The wireless module generates heat in a working process, and a heat sink is disposed to provide the wireless module with heat dissipation. An existing heat sink includes a base and a heat sink fin that is formed on the base. As heat consumption of the wireless module gradually increases, a height of the heat sink fin needs to be continuously increased when a length and a width of the heat sink are fixed. However, heat dissipation efficiency of the heat sink fin gradually decreases as the height of the heat sink fin is increased, causing a mismatch between an increase in an overall heat dissipation capability and an increase in weight.

Therefore, a heat sink with high heat dissipation efficiency is a focus of follow-up research.

SUMMARY

Embodiments of the present disclosure provide a heat sink with high heat dissipation efficiency and a communications product using the heat sink.

According to a first aspect, the present disclosure provides a heat sink, including a base and a plurality of fins, where the plurality of fins are disposed on the base to form a cooling fin structure, and each of the fins includes a root and a tip that are disposed opposite to each other. The root is connected to the base, and the tip is located on a side, far away from the base, of the fin. In an embodiment, the fin is erected on a surface of the base by combining the root and the base. The fin and the base may be perpendicular to each other, or there may be a specific tilt angle between the fin and the base. A standard for setting the tilt angle is to ensure that the tip far away from the base reaches a temperature making a working medium in the fin turn from a gas state to a liquid state. A heated area, a dropping pipe, and a spacing strip that separates the heated area from the dropping pipe are formed in the fin. The heated area is located between the root and the spacing strip. The dropping pipe is located between the spacing strip and the tip. A first passage and a second passage are formed between the heated area and the dropping pipe. A hydraulic diameter of a pipeline in the heated area is less than a critical dimension such that the working medium in the heated area is heated to form a gas-liquid plug flow flowing toward the first passage and flowing into the dropping pipe through the first passage. A hydraulic diameter of the dropping pipe is greater than or equal to the critical dimension, and a pressure of liquid at an intersection of the second passage and the dropping pipe is greater than a pressure of liquid at an intersection of the second passage and the heated area such that liquid in the dropping pipe flows toward the heated area through the second passage.

The hydraulic diameter is a ratio of four times a flow cross-sectional area to a wetted perimeter. The critical dimension is a maximum hydraulic diameter of a pipeline that can be used when the working medium in the heated area is heated in the pipeline to form a gas-liquid plug flow. In other words, when the hydraulic diameter of the pipeline is greater than the critical dimension, the working medium heated in the pipeline cannot become in the gas-liquid plug flow state. A required hydraulic diameter of the pipeline varies according to different working media.

In the present disclosure, the pipeline in the heated area and the dropping pipe are formed in the fin, the heated area and the dropping pipe are isolated from each other by the spacing strip, and the first passage and the second passage are disposed at two ends of the spacing strip such that the heated area and the dropping pipe are communicated with each other. Because the base is close to a heat source, the working medium in the heated area is heated. In addition, because the hydraulic diameter of the pipeline in the heated area is less than the critical dimension, the working medium can form the gas-liquid plug flow after being heated. Air bubbles in the liquid push the liquid to flow toward the first passage at a top. The first passage is equivalent to a transverse flow gathering area at the top of the fin. Because the air bubbles in the heated area rush up, liquid reaching the first passage does not flow downward but flows along the first passage into the dropping pipe. The hydraulic diameter of the dropping pipe is greater than or equal to the critical dimension. The pressure of the liquid at the intersection of the second passage and the dropping pipe is greater than the pressure of the liquid at the intersection of the second passage and the heated area such that the liquid in the dropping pipe flows toward the heated area through the second passage. In this way, the working medium inside the fin is circulated from the heated area to the first passage, the dropping pipe, and the second passage, and then back to the heated area.

In the present disclosure, a size of the pipeline in the heated area of the heat sink is restricted, that is, the hydraulic diameter of the pipeline in the heated area is less than the critical dimension such that the working medium in the heated area is heated to form the gas-liquid plug flow. In addition, a size of a pipeline of the dropping pipe is restricted. In other words, the hydraulic diameter of the dropping pipe is greater than or equal to the critical dimension. In this way, self-circulation is formed inside the fin of the heat sink such that the gas-liquid plug flow drives more liquid working media to participate in heat exchange, thereby improving heat dissipation efficiency.

In an implementation, the pipeline in the heated area includes a plurality of longitudinal pipelines and a transverse pipeline that is communicated between the plurality of longitudinal pipelines, the longitudinal pipelines extend in a direction from the second passage to the first passage, and the transverse pipeline is configured to perform pressure balancing and temperature balancing of liquid and vapor.

In an implementation, the heated area includes a plurality of spacing zones, and each of the spacing zones separates the heated area to form the longitudinal pipelines and the transverse pipeline. The spacing zones may be in a shape of a polygon (for example, hexagons or octagons) or circle.

In an implementation, the plurality of spacing zones are arranged in two columns, and the two columns of spacing zones are interlaced. In a horizontal direction, a pipeline between two spacing zones in one column is disposed opposite to a pipeline between two spacing zones in the other column. The two columns of spacing zones form three longitudinal pipelines.

In an implementation, the longitudinal pipeline extends in a shape of a wave line.

In an implementation, a side, adjacent to the heated area, of the spacing strip is in a shape of a wave line, and a side, adjacent to the dropping pipe, of the spacing strip is straight-lined.

In an implementation, each of the spacing zones is bar-shaped, each of the spacing zones includes two straight-lined long sides, the two long sides are connected by curved sides, the spacing zones are arranged in two columns, the longitudinal pipeline is formed between two adjacent columns of spacing zones, and the transverse pipeline is formed between two adjacent spacing zones in one column.

In an implementation, both the side, adjacent to the heated area, of the spacing strip and the side, adjacent to the dropping pipe, of the spacing strip are straight-lined.

In an implementation, there are at least two columns of dropping pipes, and the dropping pipes in two adjacent columns are communicated with each other through a transverse pipeline.

In an implementation, the first passage is honeycombed, and the first passage includes at least two crisscrossed pipelines.

In an implementation, a range of the critical dimension is 0.5 mm to 20 mm. Selection of the critical dimension is associated with selection of the working medium.

In an implementation, the pipeline in the heated area of the fin and the pipeline of the dropping pipe are formed using an extrusion molding technology. In another implementation, the pipeline in the heated area of the fin and the pipeline of the dropping pipe are formed using a blow molding technology. Compared with a cast fin, a fin manufactured using the extrusion molding technology or the blow molding technology is lighter and thinner, facilitating development of light and thin communications products. A manner such as mechanical processing or welding may alternatively be used for the fin to form the pipeline in the heated area and the dropping pipe.

With reference to the foregoing implementations, the fin is plate-like. The fin and the base may be perpendicular or basically perpendicular to each other.

With reference to the foregoing implementations, the fin includes a curved surface, and a curving direction of the curved surface extends between the root and the tip, and the fin vertically extends between the top and the bottom. In an implementation, the fin has a partially-cylindrical surface or a semi-cylindrical surface, and a design of the curved surface is conducive to increasing a windward area within a same size between the root and the tip, thereby improving a heat dissipation capability. Heat of the fin is usually dissipated through air cooling in a product, and airflow flows over the fin to take away the heat. Because the tip is far away from the heat source, a temperature of the tip is lower than that of the root. In other words, temperatures from the root to the tip are distributed in a descending manner.

The curved surface is curved and extends in a smooth arc shape. The extension in the smooth arc shape does not affect mutual communication between the pipelines in the heated area, and the transverse pipeline in the heated area may also extend in an arc shape. The longitudinal pipelines in the heated area are not affected by the curved surface and still maintain a vertical tube shape, because the curving direction of the curved surface extends between the root and the tip.

With reference to the foregoing implementations, the heat sink further includes a connecting piece, and the connecting piece is connected between tips of two adjacent fins. The two adjacent fins are connected to each other by disposing the connecting piece. In this way, efficiency can be improved both in a process of making the fins and in a process of installing the fins onto the base.

Further, a plurality of holes are disposed on the connecting piece. The holes may be of a shutter structure, or openings may be directly disposed on the connecting piece. The holes can be disposed not only to help decrease a mass of the heat sink, but also help improve a heat dissipation capability, because the holes make space between the fins be communicated with the outside.

With reference to the foregoing implementations, a quantity of fins is twice a quantity of connecting pieces. A passage is disposed between two adjacent fins, and two adjacent connecting pieces are isolated by the passage. In other words, two fins and one connecting piece together form a U-shaped heat dissipation unit, the heat sink includes a plurality of heat dissipation units, and adjacent heat dissipation units are kept separated.

The connecting piece and the two adjacent fins form such an integrated structure. The integrated structure can be more easily made. For example, pipeline areas of two independent fins may be directly made using the blow molding technology on one plate. The pipeline areas of the two independent fins are spaced apart from each other using the connecting piece, and then the two fins and the connecting piece are bent using a bending technology, to form a U-shaped heat dissipation unit.

In another implementation, the heat sink includes a cover plate. A position of the cover plate is the same as a position of the connecting piece. In other words, the connecting piece is replaced with the cover plate structure. The connecting piece may be considered as a strip structure between two adjacent fins. The cover plate in this implementation may be considered as an overall plate structure. The cover plate covers a side of tips of all fins, and the cover plate is combined with the tips of the fins. The cover plate and the tips of the fins may be fastened to each other in a welding or riveting manner, or in a sliding-fit detachable connection manner. For example, a slot may be disposed on a surface of the cover plate, and the tip is nested into the slot and cooperates with the slot to implement cooperation between the cover plate and the fin. A structure of the cover plate is similar to a structure of the base. Differences between the two structures include the following: No electronic element is disposed on the cover plate, and the cover plate is configured only to fasten the fin and assist in heat dissipation; in addition to the fin fastened to the base, an electronic element is also disposed on the base. The cover plate may be disposed in parallel to the base.

In an implementation, a detachable connection structure is used between the root of the fin and the base. For example, a slot is disposed on the base, and the root is nested into the slot to cooperate with the slot to implement fastening between the base and the fin.

In another implementation, the root of the fin and the base are fastened and connected to each other in a shrink-fit, riveting, welding, or gluing manner.

According to a second aspect, the present disclosure further provides a communications product, including the heat sink and a heat emitting element, where a side, which backs on a side of the fin, of the base of the heat sink is connected to the heat emitting element in a thermally conductive manner, and the heat emitting element may be directly disposed on the base.

DESCRIPTION OF EMBODIMENTS

The following describes the embodiments of the present disclosure with reference to the accompanying drawings.

Figure 1:
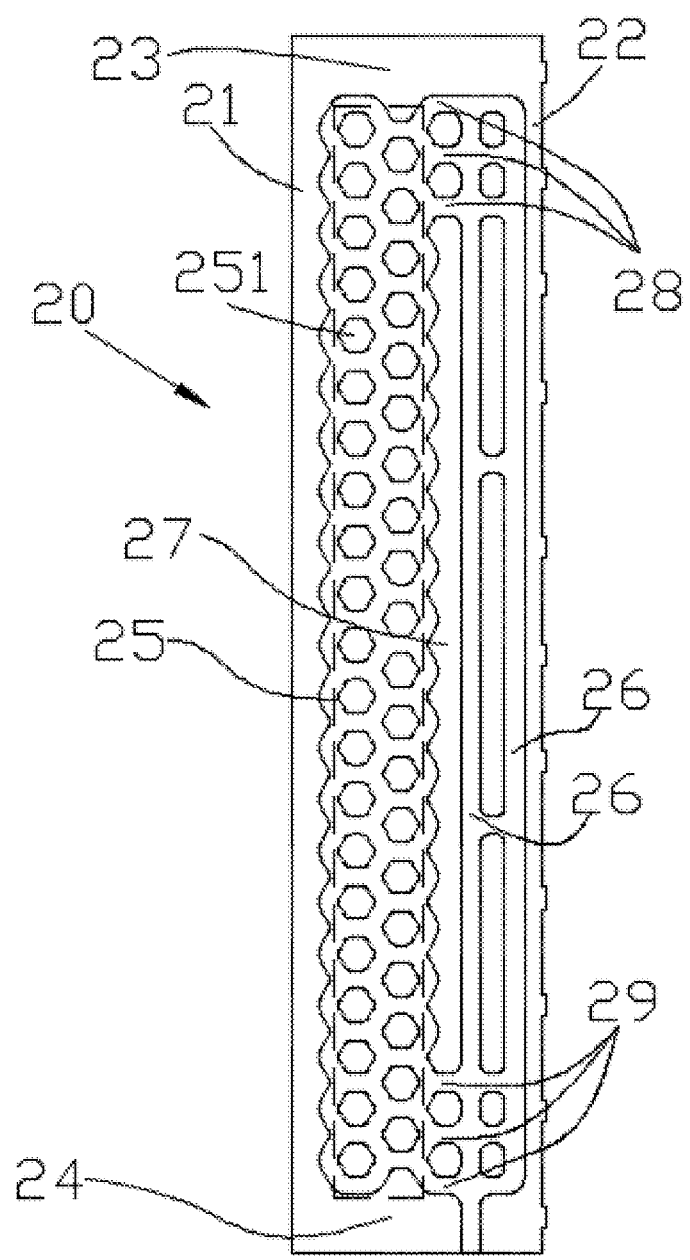
FIG. 1 is a schematic diagram of a fin of a heat sink according to an embodiment of the present disclosure.
Figure 2:
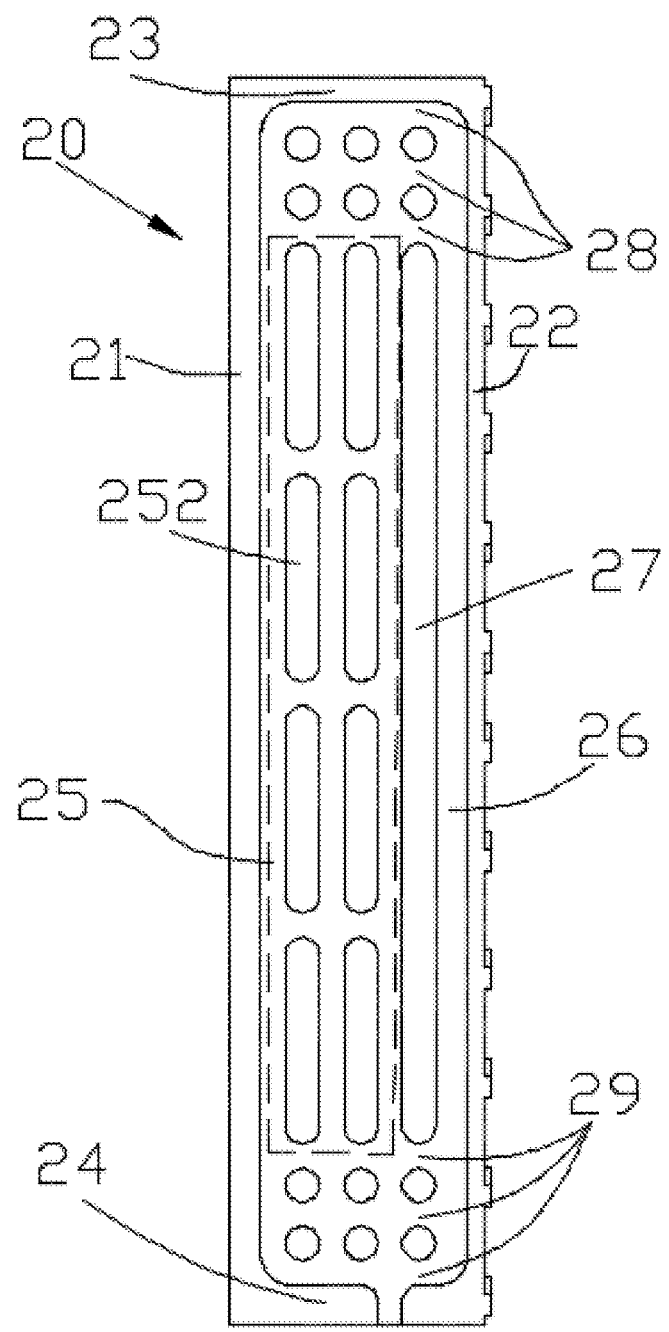
FIG. 2 is a schematic diagram of a fin of a heat sink according to another embodiment of the present disclosure.
Figure 6:
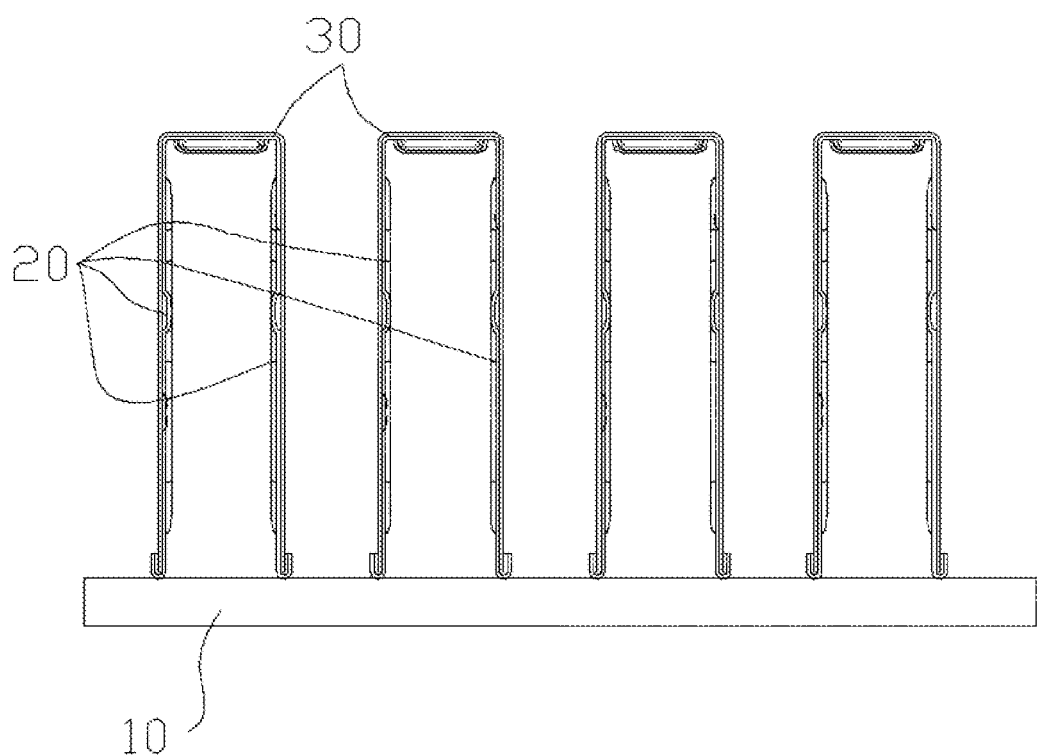
FIG. 6 is a schematic diagram of a heat sink according to an implementation of the present disclosure.

Referring to FIG. 1, FIG. 2, and FIG. 6, a heat sink in an embodiment of the present disclosure includes a base 10 and a plurality of fins 20, where the plurality of fins 20 are spaced apart on the base 10 to form a cooling fin structure. In an embodiment, the plurality of fins 20 are spaced apart from each other at an equal distance. The base 10 is made of a thermally conductive material, such as a metal plate or a ceramic base 10. The base 10 includes two surfaces that are opposite to each other. One of the two surfaces of the base 10 is configured to get in contact with a heat emitting element in a communications product, and may be disposed, using thermally conductive adhesive or a thermally conductive medium, between the base 10 and the heat emitting element such that the base 10 and the heat emitting element are thermally in contact with each other. The other surface of the base 10 is configured to install the plurality of fins 20.

Referring to FIG. 1 and FIG. 2, each of the fins 20 includes a root 21 and a tip 22 that are disposed opposite to each other. Each of the fins 20 further includes a top 23 and a bottom 24 that are disposed opposite to each other and connected between the root 21 and the tip 22. In an embodiment, the fin 20 is in a square or rectangle as a whole, and the root 21, the tip 22, the top 23, and the bottom 24 are respectively located on four sides of the fin 20. The root 21 is connected to the base 10. In an embodiment, the fin 20 is erected on a surface of the base 10 by combining the root 21 and the base 10. The fin 20 and the base 10 may be perpendicular to each other, or there may be a specific tilt angle between the fin 20 and the base 10. A standard for setting the tilt angle is to ensure that the tip 22 far away from the base 10 reaches a temperature making a working medium in the fin 20 turn from a gas state to a liquid state. In an embodiment, the fin 20 is roughly in a rectangular plate shape, the root 21 and the tip 22 are located on two opposite long sides of the rectangular plate shape, and the top 23 and the bottom 24 are located on two opposite short sides of the rectangular plate shape.

A heated area 25, a dropping pipe 26, and a spacing strip 27 that separates the heated area 25 from the dropping pipe 26 are formed in the fin 20. An area represented by a dashed line box in FIG. 1 or FIG. 2 is the heated area 25. In a use environment, the root 21 is closest to a heat source, and heat is transferred from the root 21 to other parts of the fin 20; therefore, a working medium in the heated area 25 is heated and starts working first. The heated area 25 is located between the root 21 and the spacing strip 27. The dropping pipe 26 is located between the spacing strip 27 and the tip 22. A first passage 28 and a second passage 29 are formed between the heated area 25 and the dropping pipe 26. The first passage 28 is located between the spacing strip 27 and the top 23, and the second passage 29 is located between the spacing strip 27 and the bottom 24. A hydraulic diameter of a pipeline in the heated area 25 is less than a critical dimension such that the working medium in the heated area 25 is heated to form a gas-liquid plug flow flowing toward the first passage 28 and flowing into the dropping pipe 26 through the first passage 28. A hydraulic diameter of a pipeline of the dropping pipe 26 is greater than or equal to the critical dimension, and a pressure of liquid at an intersection of the second passage 29 and the dropping pipe 26 is greater than a pressure of liquid at an intersection of the second passage 29 and the heated area 25 such that liquid in the dropping pipe 26 flows toward the heated area 25 through the second passage 29. The hydraulic diameter (hydraulic diameter) is a ratio of four times a flow cross-sectional area to a wetted perimeter. The critical dimension is a maximum hydraulic diameter of a pipeline that can be used when the working medium in the heated area is heated in the pipeline to form a gas-liquid plug flow. In other words, when the hydraulic diameter of the pipeline is greater than the critical dimension, the working medium heated in the pipeline cannot become in the gas-liquid plug flow state. A required hydraulic diameter of the pipeline varies according to different working media.

In the present disclosure, the pipeline in the heated area 25 and the dropping pipe 26 are formed in the fin 20, the heated area 25 and the dropping pipe 26 are isolated from each other by the spacing strip 27, and the first passage 28 and the second passage 29 are disposed at two ends of the spacing strip 27 such that the heated area 25 and the dropping pipe 26 are communicated with each other. Because the base 10 is close to the heat source, the working medium in the heated area 25 is heated. In addition, because the hydraulic diameter of the pipeline in the heated area 25 is less than the critical dimension, the working medium can form the gas-liquid plug flow after being heated. Air bubbles in the liquid push the liquid to flow toward the first passage 28 at the top 23. The first passage 28 is equivalent to a transverse flow gathering area at the top 23 of the fin 20. Because the air bubbles in the heated area 25 rush up, liquid reaching the first passage 28 does not flow downward but flows along the first passage 28 into the dropping pipe 26. In the embodiments shown in FIG. 1 and FIG. 2, three side-by-side first passages 28 are formed between the spacing strip 27 and the top 23. Similarly, three side-by-side second passages 29 are formed between the spacing strip 27 and the bottom 24. The pressure of the liquid at the intersection of the second passage 29 and the dropping pipe 26 is greater than the pressure of the liquid at the intersection of the second passage 29 and the heated area 25 such that the liquid in the dropping pipe 26 flows toward the heated area 25 through the second passage 29. In this way, the working medium inside the fin 20 is circulated from the heated area 25 to the first passage 28, the dropping pipe 26, and the second passage 29, and then back to the heated area 25.

The first passage 28 and the second passage 29 are honeycombed. In an embodiment, the first passage 28 and the second passage 29 each include at least two crisscrossed pipelines. The pipeline in the heated area 25 includes a plurality of longitudinal pipelines that extend from the bottom 24 to the top 23, and a plurality of transverse pipelines that are communicated between the longitudinal pipelines. The transverse pipeline is configured to perform pressure balancing and temperature balancing of liquid and vapor. In an embodiment, the longitudinal pipelines extend in a direction from the second passage 29 to the first passage 28.

In the present disclosure, working medium circulation also exists inside the heated area 25. The transverse pipeline is communicated between the longitudinal pipelines in the heated area 25. When liquid levels of the longitudinal pipelines are different in height, liquid in a longitudinal pipeline whose liquid level is relatively high flows through the transverse pipeline into a longitudinal pipeline whose liquid level is relatively low such that a pressure and a temperature of liquid and vapor in the heated area are balanced.

In the embodiment shown in FIG. 1, the pipelines in the heated area 25 are honeycombed, and the heated area 25 is separated by a plurality of polygonal (which may be hexagonal, octagonal, or the like) or small round cake-shaped spacing zones 251 in the heated area 25 to form the pipelines (the pipelines herein are the longitudinal passage and the transverse passage). In other words, a pipeline is formed between two adjacent spacing zones 251. The small cake-shaped spacing zones 251 are vertically arranged in two columns, and the two columns of small cake-shaped spacing zones 251 are interlaced. In a horizontal direction, a pipeline between two spacing zones 251 in one column is exactly disposed opposite to a pipeline between two spacing zones 251 in the other column. The two columns of spacing zones 251 form three longitudinal pipelines. In the embodiment shown in FIG. 1, the longitudinal pipelines are rising pipelines. The longitudinal pipeline extends in a shape of a wave line. A side, adjacent to the heated area 25, of the spacing strip 27 is in a shape of a wave line, and a side, adjacent to the dropping pipe 26, of the spacing strip 27 is straight-lined.

In the embodiment shown in FIG. 2, the heated area 25 is separated by a plurality of bar-shaped spacing zones 252 in the heated area 25 to form the pipelines. The bar-shaped spacing zone 252 includes two straight-lined long sides, and the two long sides are connected by curved sides. The bar-shaped spacing zones 252 are vertically arranged in two columns, and the transverse pipeline is formed between two adjacent spacing zones 252 in one column. In the embodiment shown in FIG. 2, the longitudinal pipelines extend as straight-lined pipelines. The spacing strip 27 is also bar-shaped. A shape of the spacing strip 27 is similar to a shape of the spacing zone 252. Both the side, adjacent to the heated area 25, of the spacing strip 27 and the side, adjacent to the dropping pipe 26, of the spacing strip 27 are straight-lined.

There is at least one column of dropping pipes 26. In an implementation, as shown in FIG. 1, there are two or more columns of dropping pipes 26, and adjacent dropping pipes 26 are communicated with each other through a transverse pipeline.

In an implementation, a range of the critical dimension is 0.5 mm to 20 mm. Selection of the critical dimension is associated with selection of the working medium.

In an implementation, the pipeline in the heated area 25 of the fin 20 and the pipeline of the dropping pipe 26 are formed using an extrusion molding technology. In another implementation, the pipeline in the heated area 25 of the fin 20 and the pipeline of the dropping pipe 26 are formed using a blow molding technology. Compared with a cast fin 20, a fin 20 manufactured using the extrusion molding technology or the blow molding technology is lighter and thinner, facilitating development of light and thin communications products.

With reference to the foregoing implementations, the fin 20 is plate-like. The fin 20 and the base 10 may be perpendicular or basically perpendicular to each other.

In another implementation, the fin 20 may be a non-plate structure, and the fin 20 includes a curved surface. In an embodiment, a curving direction of the curved surface extends between the root 21 and the tip 22, and the fin 20 vertically extends between the top 23 and the bottom 24. In an implementation, the fin 20 has a partially-cylindrical surface or a semi-cylindrical surface, and a design of the curved surface is conducive to increasing a windward area within a same size between the root 21 and the tip 22, thereby improving a heat dissipation capability. Heat of the fin 20 is usually dissipated through air cooling in a product, and airflow flows over the fin 20 to take away the heat. Because the tip 22 is far away from the heat source, a temperature of the tip 22 is lower than that of the root 21. In other words, temperatures from the root 21 to the tip 22 are distributed in a descending manner.

The curved surface is curved and extends in a smooth arc shape. The extension in the smooth arc shape does not affect mutual communication between the pipelines in the heated area 25, and the transverse pipeline in the heated area 25 may also extend in an arc shape. The longitudinal pipelines in the heated area 25 are not affected by the curved surface and still maintain a vertical tube shape, because the curving direction of the curved surface extends between the root 21 and the tip 22.

Figure 3:
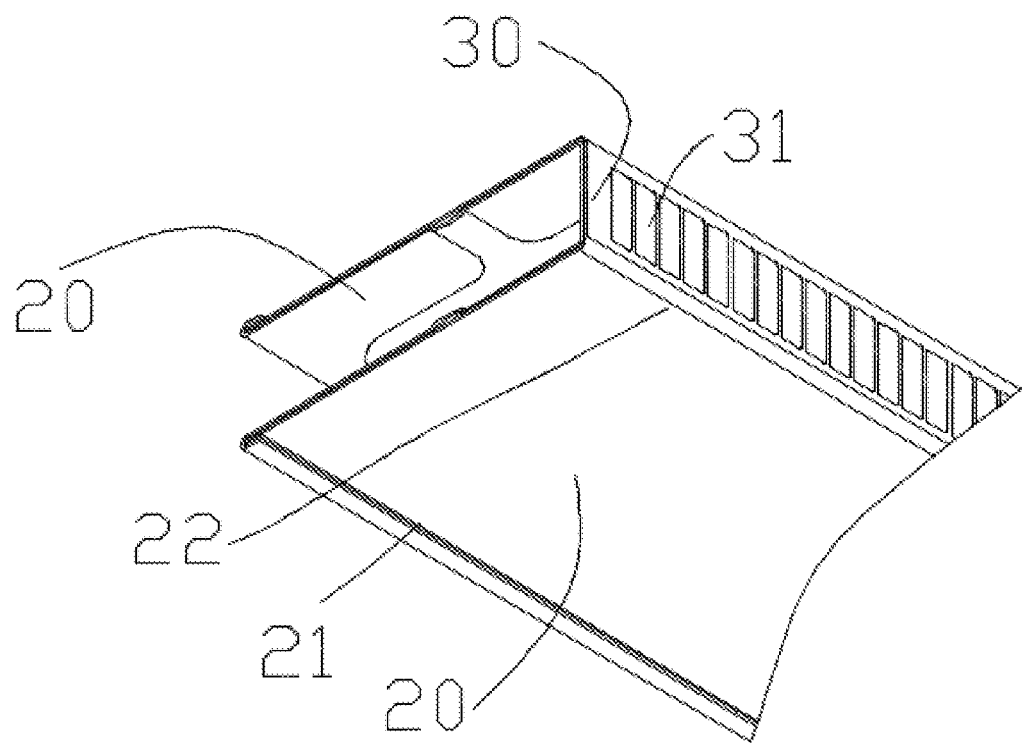
FIG. 3 is a schematic diagram of a heat dissipation unit including two fins of a heat sink according to an embodiment of the present disclosure.
Figure 4:
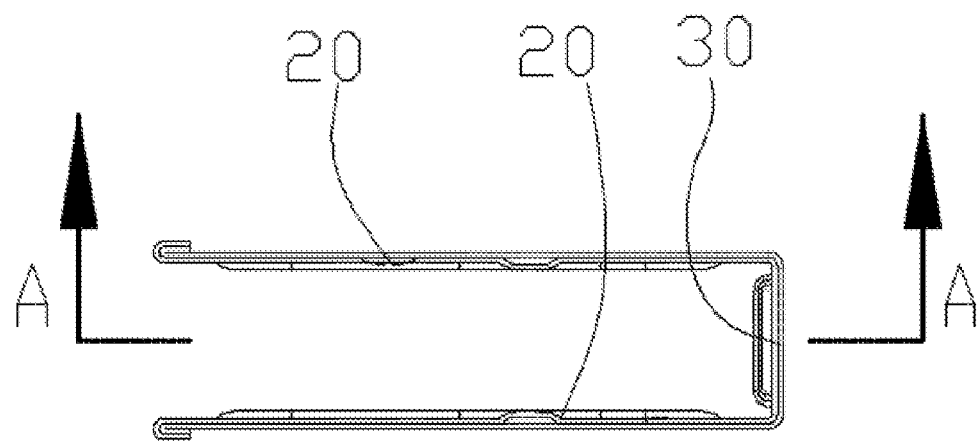
FIG. 4 is a schematic plane view of one end of the heat dissipation unit shown in FIG. 3.
Figure 5:
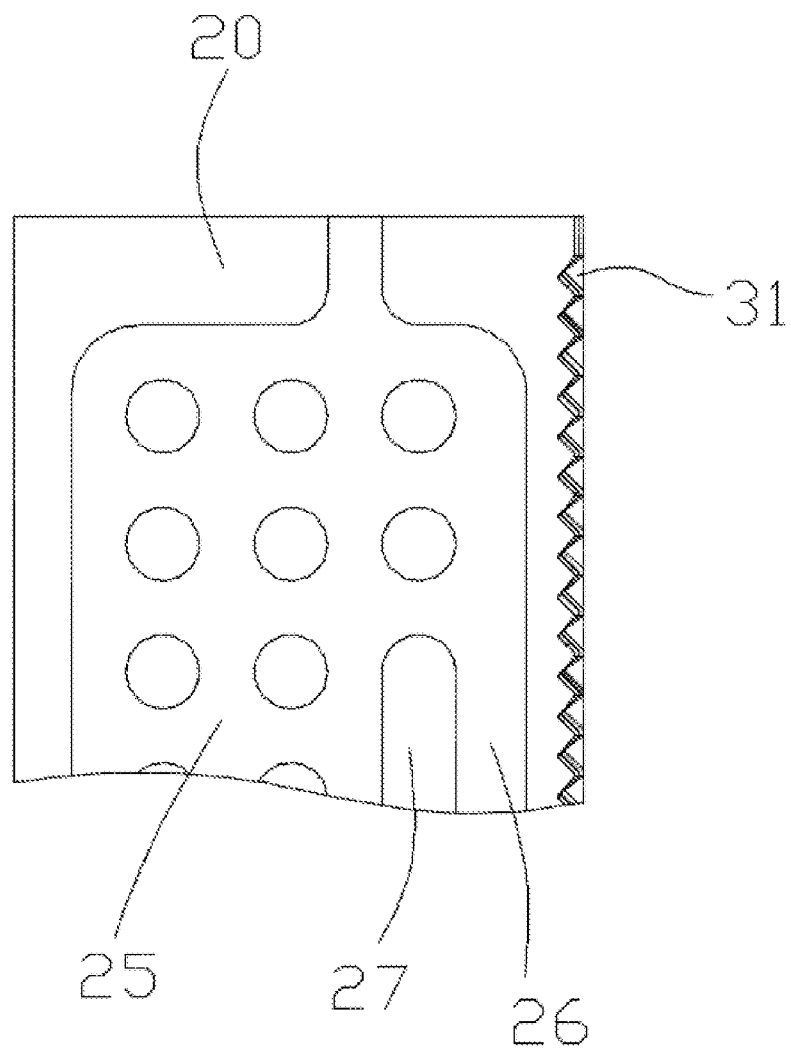
FIG. 5 is a schematic partial view of a cross section of the heat dissipation unit shown in FIG. 4 in an A-A direction.

As shown in FIG. 3, FIG. 4, and FIG. 5, with reference to the foregoing implementations, the heat sink further includes a connecting piece 30, and the connecting piece 30 is connected between tips 22 of two adjacent fins 20. The two adjacent fins 20 are connected to each other by disposing the connecting piece 30. In this way, efficiency can be improved both in a process of making the fins 20 and in a process of installing the fins 20 onto the base 10.

Further, a plurality of holes 31 are disposed on the connecting piece 30. The holes 31 may be of a shutter structure, or openings may be directly disposed on the connecting piece 30. The holes 31 can be disposed not only to help decrease a mass of the heat sink, but also help improve a heat dissipation capability, because the holes 31 make space between the fins 20 be communicated with the outside.

With reference to the foregoing implementations, a quantity of fins 20 is twice a quantity of connecting pieces 30. A passage is disposed between two adjacent fins 20, and two adjacent connecting pieces 30 are isolated by the passage. In other words, two fins 20 and one connecting piece 30 together form a U-shaped heat dissipation unit, the heat sink includes a plurality of heat dissipation units, and adjacent heat dissipation units are kept separated through the passage.

As shown in FIG. 3 to FIG. 6, in an implementation, pipelines of the fins 20 of the heat dissipation unit are formed on an inner side. In other words, each fin 20 includes two faces. Pipelines are disposed on one face, and the other face is a plane. In each heat dissipation unit, pipelines are disposed on faces that are of one fin 20 and the other fin 20 and that are opposite to each other, and the other face of each fin 20 is a plane. Such a design makes the pipelines of the heat sink be concealed in an inner side of space that is formed by a pair of fins 20, the connecting piece 30, and the base 10 such that an appearance of the heat sink is smooth and flat.

The connecting piece 30 and the two adjacent fins 20 form such an integrated structure. The integrated structure can be more easily made. For example, pipeline areas of two independent fins 20 may be directly made using the blow molding technology on one plate. The pipeline areas of the two independent fins 20 are spaced apart from each other using the connecting piece 30, and then the two fins 20 and the connecting piece 30 are bent using a bending technology, to form a U-shaped heat dissipation unit.

A detached structure may alternatively be used between the connecting piece 30 and the two adjacent fins 20, to install the connecting piece 30 onto the fins 20 through structural cooperation (for example, using a connection manner such as welding, gluing, or screw fastening). The connecting piece 30 is connected to the fins 20, to ensure structural stability of the fins 20.

In another implementation, the heat sink includes a cover plate. A position of the cover plate is the same as a position of the connecting piece 30. In other words, the connecting piece 30 is replaced with the cover plate structure. The connecting piece 30 may be considered as a strip structure between two adjacent fins. The cover plate in this implementation may be considered as an overall plate structure. The cover plate covers a side of tips 22 of all fins 20, and the cover plate is combined with the tips 22 of the fins 20. The cover plate and the tips 22 of the fins 20 may be fastened to each other in a welding or riveting manner, or in a sliding-fit detachable connection manner. For example, a slot may be disposed on a surface of the cover plate, and the tip 22 is nested into the slot and cooperates with the slot to implement cooperation between the cover plate and the fin 20. A structure of the cover plate is similar to a structure of the base 10. Differences between the two structures include the following: No electronic element is disposed on the cover plate, and the cover plate is configured only to fasten the fin and assist in heat dissipation; in addition to the fin 20 fastened to the base, an electronic element is also disposed on the base 10. In other words, the base 10 may be a circuit board on which an electronic element and a connection interface are disposed, and the heat emitting element is disposed on a side, which backs on a side of the fin 20, of the base 10. The cover plate may be disposed in parallel to the base 10.

In an implementation, a detachable connection structure is used between the root 21 of the fin 20 and the base 10. For example, a slot is disposed on the base 10, and the root 21 is nested into the slot to cooperate with the slot to implement fastening between the base 10 and the fin 20.

In another implementation, the root 21 of the fin 20 and the base 10 are fastened and connected to each other in a welding or gluing manner.

The present disclosure further provides a communications product, including the heat sink and a heat emitting element. A side, which backs on a side of the fin 20, of the base 10 of the heat sink is connected to the heat emitting element in a thermally conductive manner. The heat emitting element and the base 10 may be fit using a thermally conductive medium, or may be directly in contact with each other. A position of the heat emitting element on the base 10 is exactly opposite to a middle area between the top 23 and the bottom 24 of the fin 20.

In the present disclosure, a size of the pipeline in the heated area of the heat sink is restricted, that is, the hydraulic diameter of the pipeline in the heated area is less than the critical dimension such that the working medium in the heated area is heated to form the gas-liquid plug flow. In addition, a size of a pipeline of the dropping pipe is restricted. In other words, the hydraulic diameter of the dropping pipe is greater than or equal to the critical dimension. In this way, self-circulation is formed inside the fin of the heat sink such that the gas-liquid plug flow drives more liquid working media to participate in heat exchange, thereby improving heat dissipation efficiency and avoiding a case that the liquid working media staying in the bottom of the heat sink do not participate in the heat exchange.

On a basis of improving the heat dissipation efficiency, compared with a heat sink in the prior art, the heat sink provided in the present disclosure can implement a same amount of dissipated heat, with only a relatively small size and volume.

What is claimed is:

1. A heat sink, comprising:
a base; and
a plurality of fins disposed on the base to form a cooling fin structure, wherein each of the plurality of fins comprises:
a root connected to the base;
a tip located on a side opposite to the base;
a heated area located between the root and a spacing strip;
a dropping pipe located between the spacing strip and the tip, wherein the spacing strip separates the heated area from the dropping pipe in the fin,
a first passage; and
a second passage, wherein the first passage and the second passage are formed between the heated area and the dropping pipe,
wherein the heated area is configured to heat a working medium in the heated area to form a gas-liquid plug flow flowing toward the first passage and into the dropping pipe through the first passage, and
wherein the heat sink is configured by configuring a hydraulic diameter of a pipeline in the heated area and a hydraulic diameter of a pipeline of the dropping pipe according to a critical dimension, wherein the critical dimension is a maximum hydraulic diameter of a pipeline that can be used when the working medium in the heated area is heated in the pipeline to form the gas-liquid plug flow, so that a pressure of liquid at an intersection of the second passage and the dropping pipe is greater than a pressure of liquid at an intersection of the second passage and the heated area such that liquid in the dropping pipe flows toward the heated area through the second passage when the working medium is heated.

2. The heat sink according to claim 1, wherein the pipeline in the heated area comprises a plurality of longitudinal pipelines and a transverse pipeline that is disposed between the plurality of longitudinal pipelines, wherein the longitudinal pipelines extend in a direction from the second passage to the first passage, and wherein the transverse pipeline is configured to perform pressure balancing and temperature balancing of liquid and vapor.

3. The heat sink according to claim 2, wherein the heated area comprises a plurality of spacing zones, and wherein each of the spacing zones separates the heated area to form the longitudinal pipelines and the transverse pipeline.

4. The heat sink according to claim 3, wherein the plurality of spacing zones are arranged in two columns, and wherein the two columns of spacing zones are interlaced and form three longitudinal pipelines.

5. The heat sink according to claim 3, wherein the plurality of spacing zones are in a shape of a polygon or circle.

6. The heat sink according to claim 3, wherein each of the plurality spacing zones is bar-shaped, wherein each of the plurality of spacing zones comprises two straight-lined long sides, wherein the two straight-lined long sides are connected by curved sides, wherein the plurality of spacing zones are arranged in two adjacent columns, wherein a longitudinal pipeline is formed between the two adjacent columns of the plurality of spacing zones, and wherein the transverse pipeline is formed between two adjacent spacing zones in one column.

7. The heat sink according to claim 2, wherein each of the longitudinal pipelines extend in a shape of a wave line.

8. The heat sink according to claim 1, wherein a side adjacent to the heated area of the spacing strip is in a shape of a wave line, and wherein a side adjacent to the dropping pipe of the spacing strip is straight-lined.

9. The heat sink according to claim 1, wherein both a side adjacent to the heated area of the spacing strip and a side adjacent to the dropping pipe of the spacing strip are straight-lined.

10. The heat sink according to claim 1, further comprising at least one column of dropping pipes, and wherein at least one column of dropping pipes are in two adjacent columns communicated with each other through a transverse pipeline.

11. The heat sink according to claim 1, wherein the first passage is honeycombed, and wherein the first passage comprises at least two crisscrossed pipelines.

12. The heat sink according to claim 1, wherein a range of the critical dimension is between 0.5 millimeters (mm) to 20 mm.

13. The heat sink according to claim 1, wherein the fin is structured as a plate.

14. The heat sink according to claim 1, further comprising a connecting piece connecting tips of two adjacent fins.

15. The heat sink according to claim 14, wherein a plurality of holes are disposed on the connecting piece.

16. The heat sink according to claim 14, wherein a quantity of the plurality fins is twice a quantity of connecting pieces.

17. The heat sink according to claim 16, wherein a passage is disposed between two adjacent fins, and wherein two adjacent connecting pieces are isolated by the passage.

18. The heat sink according to claim 1, further comprising a cover plate, wherein the plurality of fins are fastened between the cover plate and the base.

19. The heat sink according to claim 18, wherein the base is a circuit board, and wherein a heat emitting element is disposed on a side opposite of the fins.

20. A communications product, comprising:
  a heat emitting element, and heat of the heat emitting element is conducted from a side, which backs on a side of the fin, of the base of the heat sink to the base; and
  a heat sink, comprising:
    a base; and
    a plurality of fins disposed on the base to form a cooling fin structure, wherein each of the plurality of fins comprises:
      a root connected to the base; and
      a tip located on a side opposite to the base;
      a heated area located between the root and a spacing strip;
      a dropping pipe located between the spacing strip and the tip, wherein the spacing strip separates the heated area from the dropping pipe in the fin;
      a first passage; and
      a second passage, wherein the first passage and the second passage are formed between the heated area and the dropping pipe,
    wherein the heated area is configure to heat a working medium in the heated area to form a gas-liquid plug flow flowing toward the first passage and into the dropping pipe through the first passage, and
    wherein the heat sink is configured by configuring a hydraulic diameter of a pipeline in the heated area and a hydraulic diameter of a pipeline of the dropping pipe according to a critical dimension, wherein the critical dimension is a maximum hydraulic diameter of a pipeline that can be used when the working medium in the heated area is heated in the pipeline to form the gas-liquid plug flow, so that a pressure of liquid at an intersection of the second passage and the dropping pipe is greater than a pressure of liquid at an intersection of the second passage and the heated area such that liquid in the dropping pipe flows toward the heated area through the second passage when the working medium is heated.

* * * * *